United States Patent [19]

Heron

[11] 3,710,210

[45] Jan. 9, 1973

[54] ELECTRICAL COMPONENT HAVING AN ATTACHED LEAD ASSEMBLY

[75] Inventor: John B. Heron, Wichita Falls, Tex.

[73] Assignee: Sprague Electric Company, North Adams, Mass.

[22] Filed: April 13, 1972

[21] Appl. No.: 243,677

[52] U.S. Cl. ....................317/258, 317/242, 317/261, 338/329, 338/332

[51] Int. Cl. ....................H01g 1/14

[58] Field of Search..............317/242, 258, 260, 261; 338/332, 329

[56] References Cited

UNITED STATES PATENTS 3,307,134 2/1967 Griest....................338/332

3,452,257 6/1969 Belko....................317/261

FOREIGN PATENTS OR APPLICATIONS 140,199 2/1951 Australia....................317/260

*Primary Examiner*—E. A. Goldberg

*Attorney*—Arthur G. Connolly et al.

[57] ABSTRACT

A ceramic chip capacitor is dipped in conductive termination paint so that there is a complete band of the conductive material all the way around the end of the chip and on the end surface. Leads having a nailhead type end that has larger overall dimensions than the end of the chip are soldered to the conductive end termination of the chip. A solder fillet forms all the way around the chip to the nailhead lead and extends over the edge of the chip producing a mechanical saddle all around the chip that provides an advantageously strong bond therewith.

7 Claims, 3 Drawing Figures

ELECTRICAL COMPONENT HAVING AN ATTACHED LEAD ASSEMBLY

BACKGROUND OF THE INVENTION

This invention relates to a lead assembly for electrical components, and more particularly, to a nailhead lead assembly for miniature electrical components wherein the nailheads have larger overall dimensions than the end of the component.

Prior art users of nailhead leads with miniature electrical components have used very small nailheads which were well within the end area of the component to which they are to be attached. One of the biggest problems with this practice has been opens or intermittent contact of the nailhead to the metallized terminations on the ends of the component. This is due to small solder fillets or inadequate solder contact or to poor termination paint adhesion to the end of the component. Consequently, the termination paint or the nailhead lead may pull off the end of the miniature component during a subsequent molding process, or the like, because the bond strength is not very good. Accordingly, it is an object of the present invention to provide a nailhead lead for an electrical component that bonds so strongly thereto that pulling the leads in an axial direction will cause the component to break before the lead will pull away from the end of the component.

It is another object of this invention to provide a lead that will create a mechanical lock in the molded material used subsequently thereon.

It is still another object of this invention to eliminate the need for specific indexing when the round nailhead leads are used in a tubular package for automatic lead insertion equipment.

SUMMARY OF THE INVENTION

A nailhead lead wire, having a nailhead or flattened portion whose overall dimensions are larger than the end portion of a monolithic ceramic capacitor chip, is attached to conductive end terminations on the chip as by soldering so as to form a strong and adherent bond therewith. The conductive end terminations are painted on opposite edges of the ceramic chip by dipping so that there is a complete band of conductive material all the way around the end of the chip and the end surface itself. When the nailhead leads are soldered to this end termination, a solder fillet forms all the way around the chip to the nailhead lead which extends over the edge of the chip. Thus a strong and firm mechanical saddle around the chip is formed by the solder. A molded coating may then be applied over the chip and the nailhead portion of the leads creating a mechanical lock in the molded material.

DESCRIPTION OF THE PREFERRED EMBODIMENT

Figure 1:
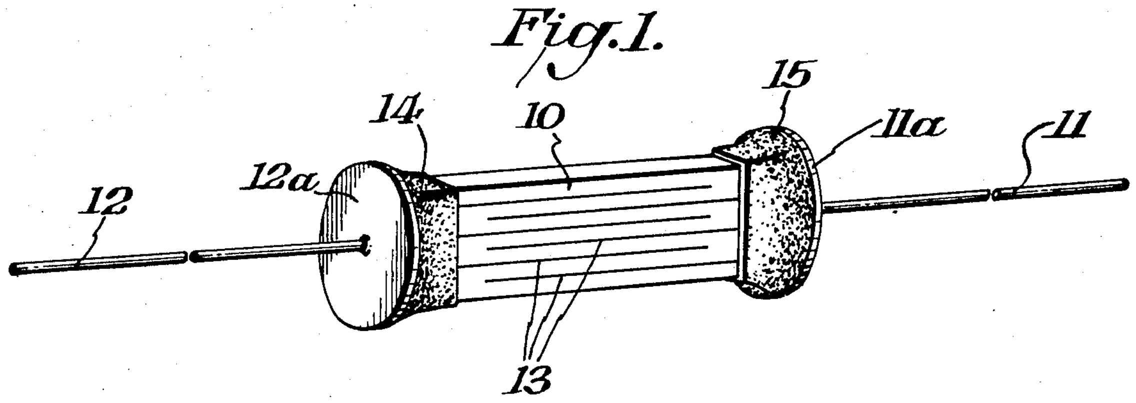
FIG. 1 is a front elevational view of a ceramic capacitor utilizing the nailhead leads of this invention.

This invention is best described by reference to the drawings. In FIG. 1, a ceramic capacitor chip 10 has metallic film layers 13 that extend to the middle of the capacitor unit from alternate sides thereof separated by layers of ceramic material, forming the capacitor 10. The capacitor 10 has silver terminations applied on opposite edges thereof so as to form a band of silver completely around the end of the chip and on the end surface itself. Lead wires 11 and 12 have nailhead or flattened end portions 11*a* and 12*a* respectively, that have overall dimensions that are larger than the ends of the ceramic chip 10. When the nailhead leads 11 and 12 are soldered to the end silver terminations, solder fillets 14 and 15 are formed completely around the metallized end portions of ceramic chip 10 to the nailheads 11*a* and 12*a* so as to substantially cover the silver terminations and be in complete contact with the nailhead and around the entire periphery of the ceramic chip 10 so as to insure the formation of a strong bond therewith. The silver terminations can be applied as by dipping or by any conventional technique known to those skilled in the art. While silver paint is advantageously used herein, any solderable and electrically conductive metal material may be used for metallizing the edges of the component.

Figure 2:
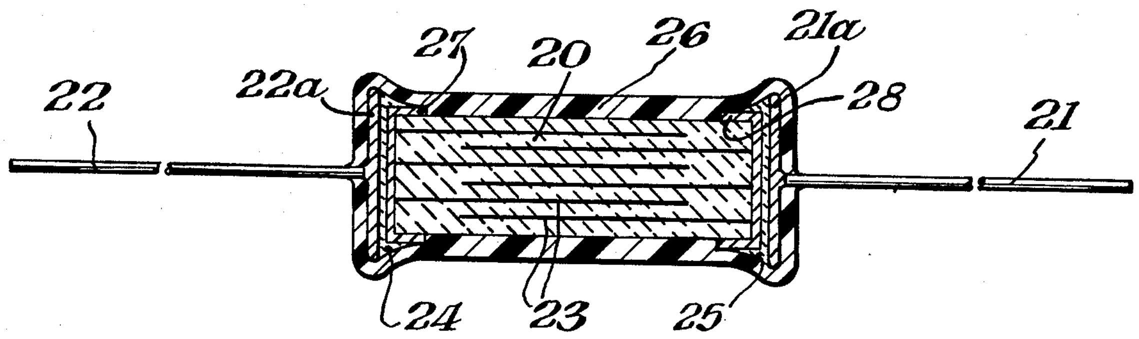
FIG. 2 is a sectional view of a protectively coated monolithic capacitor utilizing the leads of this invention.

FIG. 2 shows a cross-section of a ceramic capacitor having metallic films 23 within the ceramic chip 20 with nailhead leads 21 and 22 attached thereto. The chip 20 and the nailheads or flattened portions 21*a* and 22*a* are covered by a protective coating 26. The coating 26 may be an epoxy resin or thermosetting plastic or other protective material as known to those skilled in the art. The application of a molded coating 26 provides a further locking mechanism in conjunction with the nailhead leads of this invention. The nailhead portion of the leads 21a and 22*a* are held to the chip at the silver terminations 27 and 28 by solder as shown at 24 and 25, and are further supported from behind by the molded coating 26 so as to further prevent the leads 21 and 22 from being pulled away from the chip. If straight leads were soldered to a chip and covered with a molded coating, the design would not offer any resistance to having the leads pull straight out from the chip. While the molded coating produces the mechanical lock described above, any protective coating may be used with this invention such as a fluidized bed coating or any other convenient technique known to those skilled in the art.

Figure 3:
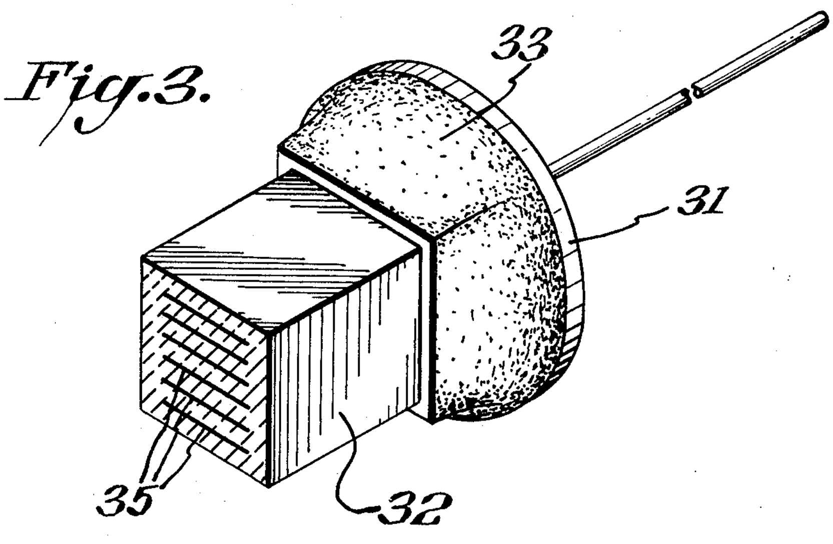
FIG. 3 is an end view of a capacitor chip attached to the nailhead portion of a lead wire of this invention.

FIG. 3 shows that a nailhead or flattened portion of a lead wire 31 has larger overall dimensions than the end portion 32 of a ceramic chip having metal layers 35 therein. It is for this reason that a strong bond can be made between the lead and the ceramic chip. A mechanical saddle 33 is formed on the nailhead 31 all the way around the chip when solder is applied thereto. If a nailhead lead was used that was smaller than the diagonal of the chip or had smaller overall dimensions than the chip, the chip would extend out over and beyond the lead, and portions of the chip would not be soldered to the lead leaving a much weaker bond than the one provided in this invention.

The term "nailhead" has been used to describe the lead configuration of this invention, however, it should be noted that a lead wire having a component contacting portion whose overall dimensions are larger than the component that is to be attached thereto is sufficient for the purposes of this invention. The component contacting portion of the lead can be of any shape — circular, rectangular, square, continuous and concentric squares, a continuous spiral formation of concentric circles, or the like, so long as this portion of the lead wire has overall dimensions that are larger than the overall dimensions of a metallized end portion of the component to be contacted.

An advantage of this invention is that when it is used on a capacitor having a thin coating thereon which conforms to the outline of the nailhead, the nailhead serves as the envelope of the package, yielding a circular cross section at the two ends of the ceramic chip. Therefore, it can be used as a tubular package for automatic lead insertion equipment in which the round nailhead eliminates the need for specific indexing. Another advantage is that the larger nailhead arrangement creates a mechanical lock when covered over with a molding material, wherein the shoulders of the molded material further inhibits the chip from separating from the nailhead.

The lead wire used in the preferred embodiment is a commercially available 100 percent tin-coated copper wire but may be any available metal wire. The tin coating of the wire and the silver terminals of the chip can advantageously be bonded together with solder composed of 95 percent tin and 5 percent silver. Other soldering compositions may also be used, such as an eutectic lead-tin solder.

Since it is obvious that many changes and modifications can be made in the above-described details without departing from the nature and spirit of the invention, it is to be understood that the invention is not limited to said details except as set forth in the appended claims.

What is claimed is:

1. An electrical component having a lead assembly attached thereto comprising:

an electrical component having at least one metallized end portion thereon;

a lead assembly having at least one lead wire with a component contacting portion thereon perpendicular to said wire, said contacting portion having larger overall dimensions than said metallized end portion;

and a soldered bond between said metallized end portion and said contacting portion, said bond is a solder fillet extending around the entire periphery of said metallized end portion and extending over the edges of said metallized end portion.

2. The electrical component of claim 1 wherein said component is a monolithic ceramic capacitor having said at least one lead wire in contact with, and extending outward from opposite metallized end portions thereof; and said component contacting portion of said at least one lead wire is in the form of a nailhead.

3. The electrical component of claim 2 wherein each of said metallized end portion is a band of silver completely around said end portion and end surface of said monolithic ceramic capacitor; said lead wire has a tinned outer coating; and said soldered bond consists of tin and silver.

4. The electrical component of claim 3 having a protective outer coating over said component, said soldered bonds and said contacting portions of said lead wires.

5. The electrical component of claim 4 wherein said protective coating is a molded material.

6. The electrical component of claim 4 wherein said protective coating is a fluidized bed coating.

7. An electrical component having a lead assembly attached thereto comprising:

a monolithic ceramic capacitor having silver terminations completely around opposite ends and the end surfaces thereof;

a lead assembly consisting of a pair of tinned lead wires, each having a component contacting portion thereon perpendicular to said wire, said contacting portion being in the form of a nailhead having larger overall dimensions than said silver terminations;

and a tin and silver soldered bond between said silver terminations and said contacting portions of said lead wire, said bond is a solder fillet extending around the entire periphery of said silver termination and extending over the edges of said silver termination.

* * * * *